(12) United States Patent
Huber

(10) Patent No.: US 6,446,244 B1
(45) Date of Patent: Sep. 3, 2002

(54) METHOD AND CIRCUIT CONFIGURATION FOR PRODUCING SINUSOIDAL/COSINUSOIDAL OSCILLATIONS

(75) Inventor: Klaus Huber, Darmstadt (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/341,887
(22) PCT Filed: Dec. 17, 1997
(86) PCT No.: PCT/DE97/02922
§ 371 (c)(1),
(2), (4) Date: Jul. 15, 1999
(87) PCT Pub. No.: WO98/32219
PCT Pub. Date: Jul. 23, 1998
(51) Int. Cl.$^7$ .................................................. G06F 9/45
(52) U.S. Cl. .......................................................... 716/8
(58) Field of Search ............................ 375/44; 716/1–21

(56) References Cited

U.S. PATENT DOCUMENTS

| | | | | |
|---|---|---|---|---|
| 3,688,098 A | | 8/1972 | Cwynar et al. | 235/197 |
| 4,893,316 A | * | 1/1990 | Janc | 375/44 |
| 5,132,636 A | | 7/1992 | Hori | 328/22 |
| 5,361,036 A | | 11/1994 | White | 329/361 |

FOREIGN PATENT DOCUMENTS

| | | |
|---|---|---|
| DE | 33 03 133 | 1/1983 |
| EP | 0 168 969 | 1/1986 |
| JP | 02 253704 | 10/1990 |

OTHER PUBLICATIONS

U. Tietze, Ch. Schenk, "Halbleiterschaltungstechnik", Springer Verlag 1980. Cited in the specification.

I. Schur, "Arithmetisches ueber die Tschebyscheffschen Polynome", Gesammelte Abhandlungen, vol. III, pp. 422–453, Springer Verlag 1973. Cited in the specification.

Abramowitz, Stegun. Handbook of Mathematical Functions. Cited in the specification.

* cited by examiner

Primary Examiner—Matthew Smith
Assistant Examiner—Thuan Do
(74) Attorney, Agent, or Firm—Kenyon & Kenyon

(57) ABSTRACT

With reference to a method and circuit arrangements, it is described how, using the Chebyshev polynomials, frequency multipliers as well as sine/cosine generators can be constructed in a general-purpose manner, i.e., circuits that are frequently required in telecommunications engineering. A number of Chebyshev modules and various multipliers and adders are realized in an integrated circuit which then carries out a wide range of different functions depending on the external wiring. Disclosed as further functions which can easily be technically realized with such a chip are the synthesis of any desired functions by representing the function by means of a Chebyshev series and the use of $T_n(x)$ as an amplifier with the amplification factor n for $\sin(nx) \approx nx$, and odd n.

5 Claims, 3 Drawing Sheets

METHOD AND CIRCUIT CONFIGURATION FOR PRODUCING SINUSOIDAL/COSINUSOIDAL OSCILLATIONS

The invention relates to a method for the generation of sinusoidal/cosinusoidal oscillations of and to a circuit arrangement for the implementation of the method.

BACKGROUND INFORMATION

Conventional methods for the generation of sinusoidal and/or cosinusoidal oscillations are used for a wide range of purposes in telecommunications engineering and in computer technology. In addition, conventional circuit arrangements can generate the sinusoidal and cosinusoidal oscillations. Various possibilities for generating such oscillations are described in the book by U. Tietze, Ch. Schenk, "Halbleiterschaltungstechnik", Springer Verlag, 1980. In telecommunications engineering, conventional Chebyshev filters are based on the Chebyshev polynomial of the n-th degree defined by $$T_n(\cos(\sigma)) = \cos(n\sigma).$$

The Chebyshev polynomials are described, for example, in I. Schur, "Arithmetisches ueber die Tschebyscheffschen Polynome", Gesammelte Abhandlungen, Vol. III, pp. 422 to 453, Springer Verlag, 1973.

U.S. Pat. No. 5,132,636 describes a method for the generation of sinusoidal oscillations. A delta oscillation is applied to an input of a programmable or a fixed program circuit module.

However, no Chebyshev polynomials are used in the method described in U.S. Pat. No. 5,132,636.

SUMMARY OF THE INVENTION

An object of the present invention is to create a method and a circuit arrangement for the generation of sinusoidal/cosinusoidal oscillations which, using simple and easy-to-combine components, permit the generation of sinusoidal/cosinusoidal oscillations in a general-purpose and fundamentally simple manner on a modular basis with the aid of the Chebyshev polynomials.

The method and device according to the present invention have the advantage that, for the generation of sinusoidal/cosinusoidal oscillations, they permit a modular circuit arrangement in that Chebyshev polynomials are implemented in such modules. This can be realized, particularly in semiconductor technology, through chips having a special structure. The Chebyshev polynomials as well as the multipliers, summing amplifiers and adder circuits used for circuit implementation can be realized using modular integrated circuit techniques, it then being possible, depending on the external wiring method, for the modules to generate an extremely wide range of desired sinusoidal/cosinusoidal oscillations. Such modules can very easily be combined due to the modular circuit structures and can be integrated into existing circuit structures.

The component names and associated reference characters used in the appended list of reference characters are used in the description and in the drawings.

DETAILED DESCRIPTION

Figure 5:
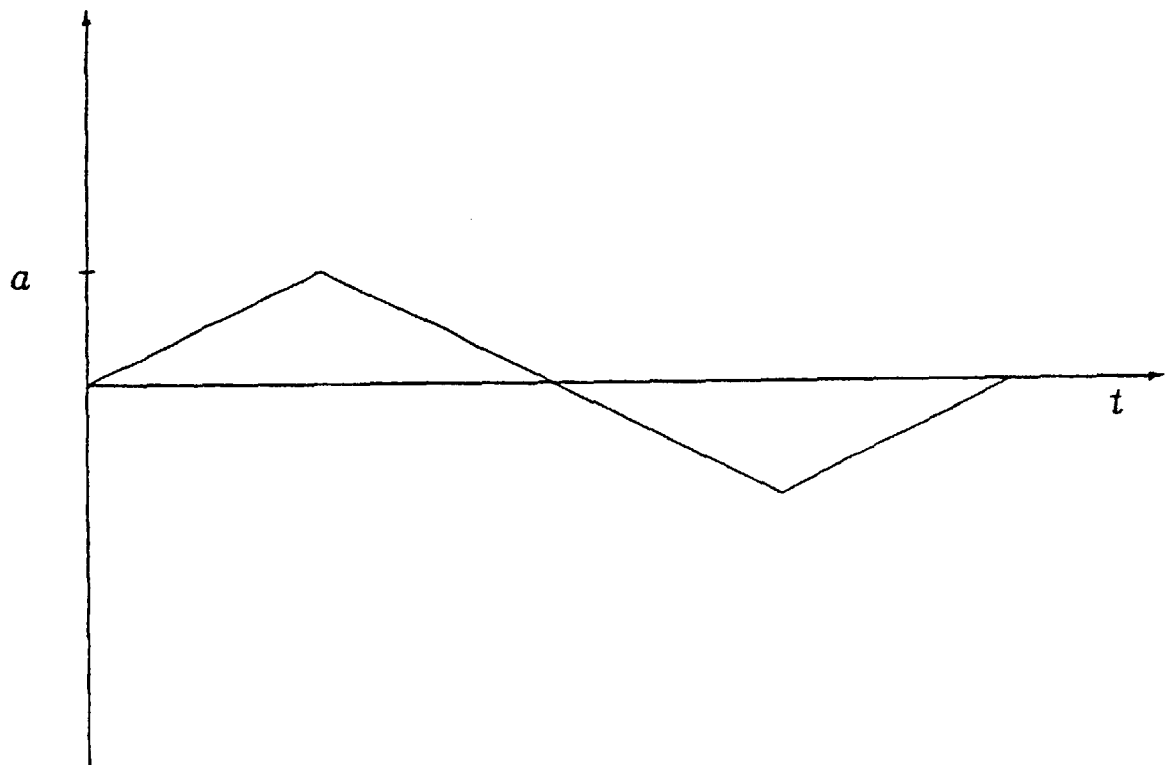
FIG. 5 shows a delta oscillation as input variable for a circuit arrangement according to the present invention.

First of all, there is to be a description of some aspects of the method described here for realization in circuit modules. For realization, use is made of a corresponding Chebyshev module, i.e., circuit modules which realize the Chebyshev polynomial $T_n(x)$, where $T_o(x)=1$, $T_1(x)=x$, $T_{n+1}=2xT_n(x)-T_{n-1}(x)$. The sinusoidal and/or cosinusoidal oscillations are obtained by applying a delta oscillation (FIG. 5) of amplitude $a=\sin(\pi/(2n))$ to a Chebyshev module $T_n(x)$, according to the equation (1)

$$T_n\left(\frac{x}{n}\right) \approx T_n\left(\sin\left(\frac{x}{n}\right)\right) = \begin{cases} \sin(x) & \text{for } n \equiv 1 \bmod 4 \\ -\cos(x) & \text{for } n \equiv 2 \bmod 4 \\ -\sin(x) & \text{for } n \equiv 3 \bmod 4 \\ \cos(x) & \text{for } n \equiv 0 \bmod 4 \end{cases} \quad (1)$$

The error occurring in this context, which can easily be calculated, becomes non-monotonically smaller for increasing n. For n=2, 3, 4, 5, the maximum error is approx. 15.2%, 1.2%, 4.0% and 0.42% respectively.

The application of Chebyshev polynomials is used here for the generation of sinusoidal/cosinusoidal oscillations. A frequency multiplier circuit according to FIGS. 1 to 4, operated around a suitably selected working point with a delta oscillation according to FIG. 5 at the input, is disclosed and described. A suitable working point is the value $\phi 0=3\pi/2$. If one substitutes into $T_n(\cos(\phi))=\cos(n\phi)$ the value $\phi=\phi 0+x$ where $\phi 0=3\pi/2$, one obtains $$T_n(\sin(x)) = \cos\left(\frac{3\pi}{2} \cdot n + n \cdot x\right),$$

from which result $$T_n(\sin(x)) = \begin{cases} \sin(nx) & \text{for } n \equiv 1 \bmod 4 \\ -\cos(nx) & \text{for } n \equiv 2 \bmod 4 \\ -\sin(nx) & \text{for } n \equiv 3 \bmod 4 \\ \cos(nx) & \text{for } n \equiv 0 \bmod 4 \end{cases}$$

If the value of x is not too great, which is the case, for example, for $|x| \leq \pi/(2n)$ if n is not too small, then, to a good approximation, $T_n(x) \approx T_n(\sin(x))$ applies, and one thus obtains $$T_n\left(\frac{x}{n}\right) \approx T_n\left(\sin\left(\frac{x}{n}\right)\right) = \begin{cases} \sin(x) & \text{for } n \equiv 1 \bmod 4 \\ -\cos(x) & \text{for } n \equiv 2 \bmod 4 \\ -\sin(x) & \text{for } n \equiv 3 \bmod 4 \\ \cos(x) & \text{for } n \equiv 0 \bmod 4 \end{cases}$$

Consequently, it follows that, with the delta oscillation (shown in FIG. 5) of amplitude $$a = \sin\left(\frac{\pi}{2n}\right) \approx \frac{\pi}{2n}$$

at the input of $T_n(x)$, there results at the output the approximation of a sinusoidal/cosinusoidal oscillation according to the above equation which becomes (non-monotonically) better with increasing n.

TABLE 2

| | | | | | Error $e_{max}$ | | | | | |
|---|---|---|---|---|---|---|---|---|---|---|
| n | 2 | 3 | 4 | 5 | 6 | 7 | 8 | 9 | 10 | 11 | 12 |
| $e_{max}$ | 15.6% | 1.2% | 4.01% | 0.422% | 1.788% | 0.214% | 1.01% | 0.129% | 0.645% | 0.086% | 0.448% |

Table 2 gives the maximum error value $$e_{max} = \max |T_n(x) - T_n(\sin(x))|$$

for x at interval $[-a, a]$, where $$a = \sin\left(\frac{\pi}{2n}\right) \approx \frac{\pi}{2n}.$$

In Table 2, for $e_{max}$, there is a reflection, to a certain degree, of the hardware complexity; this being evident, for example, in the fact that, for approximation of the sine/cosine function, the accuracy of $T_3(x)$ is greater than the accuracy of $T_4(x)$. The costs of $T_3$ are, for the majority of applications, higher than for two $T_2$ modules because of the necessary multiplier.

As already mentioned, the Chebyshev polynomials of the n-th degree $T_n(x)$ are defined by the equation:

$$T_n(\cos(\phi)) = \cos(n\phi),$$

that is: if one enters a cosinusoidal oscillation as the input variable in $T_n(x)$, then one obtains the cosinusoidal oscillation with the n-fold frequency at the output of the circuit. Information on Chebyshev polynomials is given, for example, in "Abramowitz, Stegun: Handbook of Mathematical Functions". The first Chebyshev polynomials are: $T_o(x)=1$, $T_1(x)=x$, $T_2(x)=2x^2-1$, etc. They can be realized with multipliers and adders/subtractors. The following two relations are particularly useful for the realization of any n values:

$$T_{n+m}(x) = T_n(T_m(x)) \quad (2)$$

$$T_{n+m}(x) = 2 \cdot T_m(x) \cdot T_n(x) - T_{n-m}(x) \quad (3)$$

Figure 1:
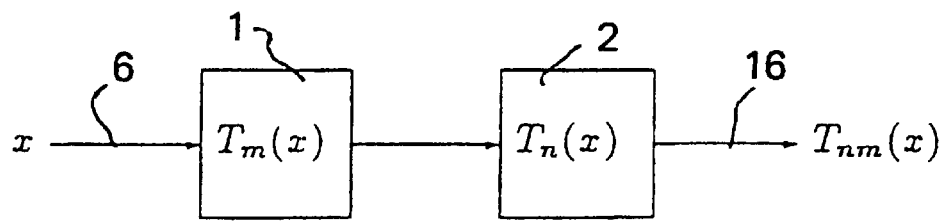
FIG. 1 shows a circuit arrangement according to the present invention for a realization of $T_{nm}(x)$.
Figure 2:
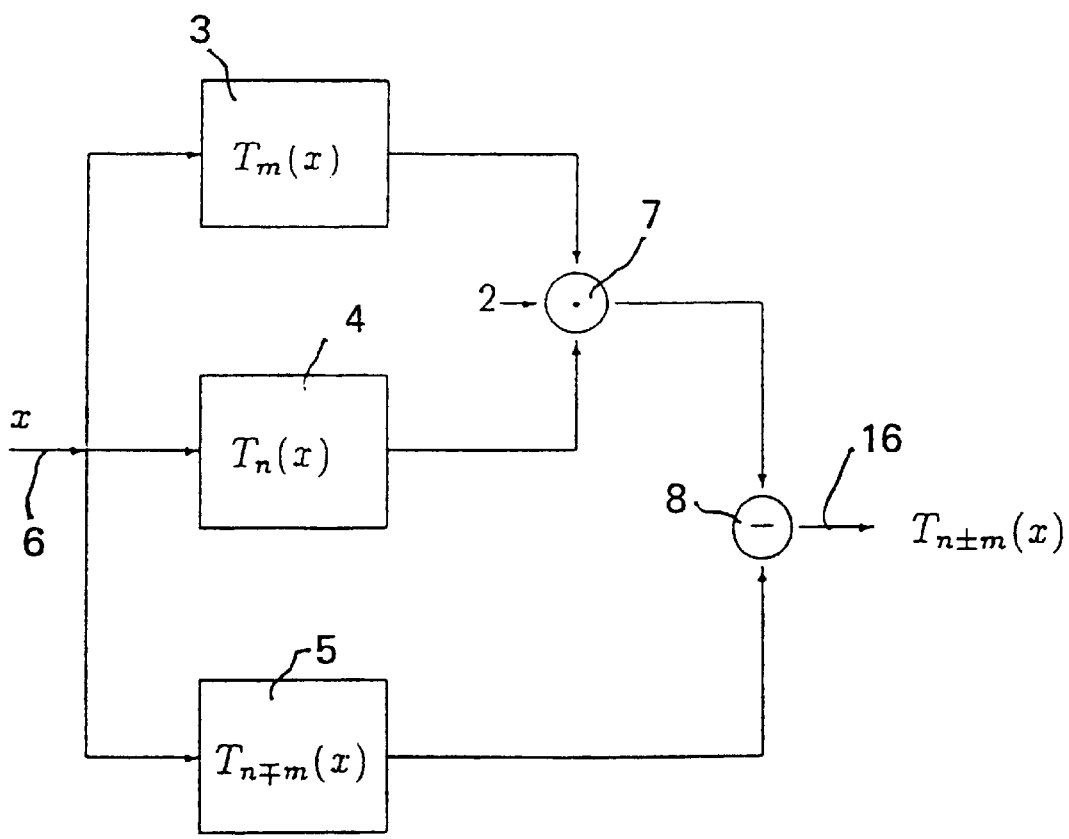
FIG. 2 shows a circuit arrangement according to the present invention for a realization of $T_{n+-m}(x)$.

The circuits for equations (2) and (3) are shown in FIGS. 1 and 2.

The circuit constructed and realized on this basis for equation (2) according to FIG. 1 consists of two series-connected Chebyshev modules 1 and 2, the input variable with the fundamental frequency being applied to Chebyshev module 1 and the output variable, the n*m multiplied frequency being available at the output of Chebyshev module 2. The realization of equation (3) is shown in FIG. 2. This circuit consists of Chebyshev modules 3, 4 and 5, the inputs of which are all supplied with the input frequency x. The outputs of Chebyshev modules 3 and 4 are sent to the input of a multiplier 7, the other input of which is supplied with a 2 for multiplication. The output of the multiplier 7 is sent along with the output of Chebyshev module 5 to a subtractor 8, at the output of which the function $T_{n+-m}(x)$ is then formed.

For any desired value N, it is possible to put together the Chebyshev module $T_N(X)$ from the circuits in FIGS. 1 and 2, there being various possibilities for realization, depending on N. The particular form of realization is selected by a worker skilled in the art as a function of the costs. In the following, for the sake of simplicity, a form of realization using operational amplifiers is assumed. The indicated circuits are not necessarily equally well suited for every application. Depending on the costs of the components used, other forms of realization may be readily possible and, in a given case, more advantageous. Using the equations given here, however, the design can easily be modified and tailored to the application in question.

Figure 3:
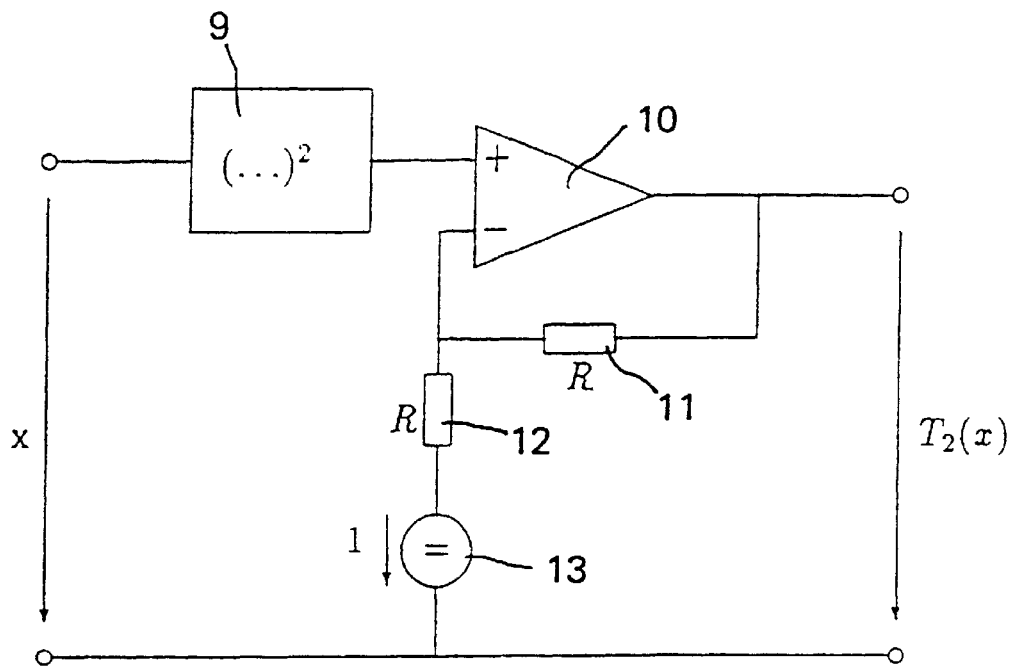
FIG. 3 shows a circuit arrangement according to the present invention for a realization of $T_2(x)$.
Figure 4:
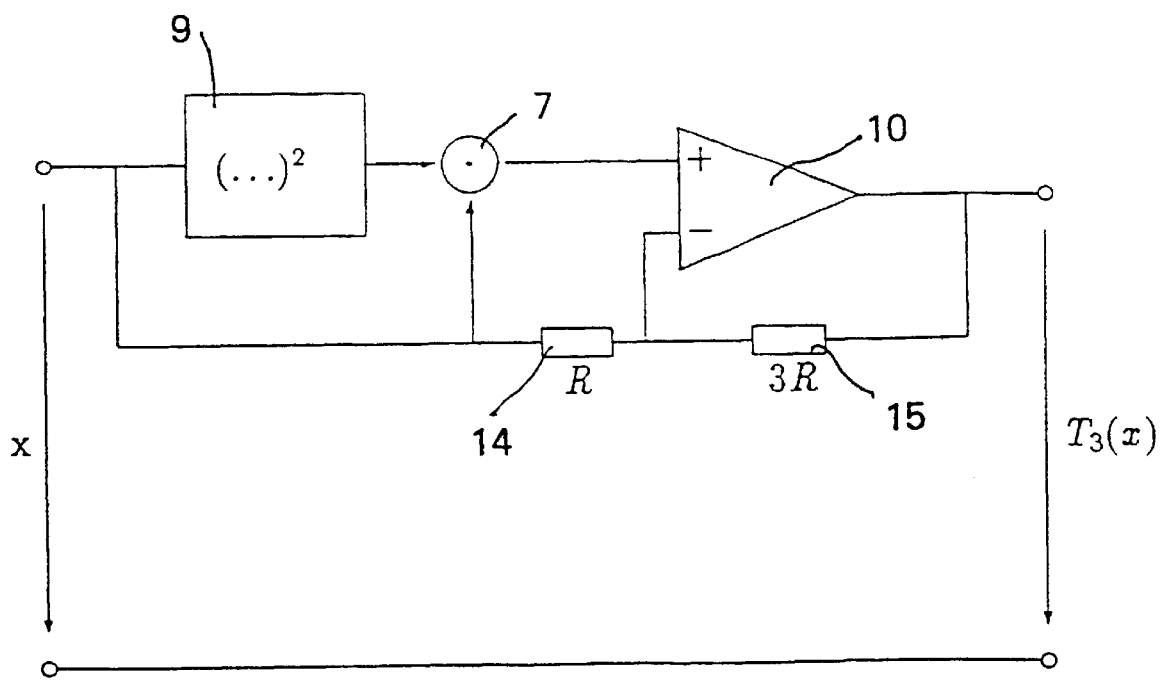
FIG. 4 shows a circuit arrangement according to the present invention for a realization of $T_3(x)$.

Using conventional operational amplifier circuits in circuit technology, one obtains for the first non-trivial polynomials $T_2(x)$ and $T_3(x)$ the circuit-related realization or implementation shown in FIGS. 3 and 4. If $K_n$ is used to denote the costs of realizing the function $T_n(x)$, then it can be seen from FIG. 3 that the polynomial $T_2$ implemented with operational amplifiers causes the costs of one squarer 9, one operational amplifier 10, two resistors 11 and 12 as well as one stable voltage source 13.

The circuit according to FIG. 4 for the realization of the function $T_2(x)$ includes, in turn, one squarer 9, one downstream multiplier 7 and one operational amplifier 10, the output signal of which is supplied via a voltage divider, including the resistors 14 and 15, to its input. The corresponding electrical variables of function $T_3(x)$ are available at the output of this circuit.

The above demonstrates that such a circuit permits the low-cost realization of circuits for frequency multiplication.

The equations useful for the synthesis of any $T_n(x)$ values are the indicated equations (2) and (3).

| List of reference characters | |
|---|---|
| 1 to 5 | Chebyshev modules |
| 6 | Circuit input |
| 7 | Multiplier |
| 8 | Subtractor |
| | Squarer |
| 10 | Operational amplifier |
| 11, 12 | Resistors |
| 13 | Stable voltage source |
| 14, 15 | Resistors |
| 16 | Circuit output |

What is claimed is:
1. A method for generating at least one of a sinusoidal oscillation and a cosinusoidal oscillation, comprising the steps of:
   (a) applying a delta oscillation to an input of a Chebyshev module, the Chebyshev module being in a form of one of an electrical circuit, a programmable circuit module and a fixed-programmable circuit module to implement the Chebyshev polynomial $T_n(x)$; and
   (b) generating at least one of the sinusoidal oscillation and the cosinusoidal oscillation by the Chebyshev module, the at least one of the sinusoidal oscillation and the cosinusoidal oscillation being made available with specific frequencies at an output of the Chebyshev module, the specific frequencies made available depending on a magnitude of a value n, the value n being a numerical value.

2. The method according to claim 1, wherein the delta oscillation has an amplitude a where $a=\sin(\pi/(2n))$ and where $\pi=3.141\ldots$, and wherein the at least one of the sinusoidal oscillation and the cosinusoidal oscillation is available at an output of the one of the electrical circuit, programmable circuit module and fixed-programmable circuit module.

3. A circuit arrangement for generating at least one of a sinusoidal oscillation and a cosinusoidal oscillation, comprising:

a Chebyshev module in a form of a semiconductor chip, a delta oscillation being applied to at least one input circuit of the semiconductor chip in order to generate at least one of the sinusoidal oscillation and the cosinusoidal oscillation.

4. The circuit arrangement according to claim 3, wherein the semiconductor chip includes a programmable memory chip.

5. The circuit arrangement according to claim 3, wherein the Chebyshev module includes a plurality of Chebyshev modules, the plurality of Chebyshev modules being in a form of at least one of a digital semiconductor chip and an analog semiconductor chip, each of the plurality of Chebyshev modules being adapted to be at least one of coupled together and connected together.

* * * * *